United States Patent [19]
Kohr

[11] Patent Number: 5,289,134
[45] Date of Patent: Feb. 22, 1994

[54] CIRCUIT FOR MONITORING CONTACT BETWEEN THE RESISTANCE TRACK AND THE WIPER OF A POTENTIOMETER

[75] Inventor: Rainer Kohr, Oberbillig, Fed. Rep. of Germany

[73] Assignee: VDO Adolf Schindling AG, Frankfurt am Main, Fed. Rep. of Germany

[21] Appl. No.: 866,311

[22] Filed: Apr. 9, 1992

[30] Foreign Application Priority Data

May 22, 1991 [DE] Fed. Rep. of Germany ....... 4116603

[51] Int. Cl.⁵ ............................................ G01R 27/14
[52] U.S. Cl. .................................... 324/714; 324/691
[58] Field of Search ............... 324/549, 600, 649, 691, 324/713, 714

[56] References Cited

U.S. PATENT DOCUMENTS

| | | | |
|---|---|---|---|
| 2,779,918 | 1/1957 | Altieri et al. | 324/723 |
| 3,810,008 | 5/1974 | Motoda et al. | 324/549 |
| 4,228,394 | 10/1980 | Crosby | 324/549 X |
| 4,264,860 | 4/1981 | Thebault | 324/713 |
| 4,920,939 | 5/1990 | Gale | 324/549 X |
| 4,972,816 | 11/1990 | Mausner | 324/549 X |
| 5,079,500 | 1/1992 | Oswald | 324/714 X |

FOREIGN PATENT DOCUMENTS 3643945 6/1988 Fed. Rep. of Germany.

Primary Examiner—Kenneth A. Wieder
Assistant Examiner—Glenn W. Brown
Attorney, Agent, or Firm—Martin A. Farber

[57] ABSTRACT

A circuit for monitoring contact between the resistance track and the wiper of a potentiometer provides for an adjustable DC voltage which can be tapped from the wiper. An alternating voltage is applied to the wiper via a series connection of a resistor and a capacitor. The resistance is greater than the impedance formed by the capacitance of the capacitor plus one-fourth of the track resistance. Circuitry for rectifying the voltage connects to a junction point between the resistor and the capacitor.

9 Claims, 2 Drawing Sheets

CIRCUIT FOR MONITORING CONTACT BETWEEN THE RESISTANCE TRACK AND THE WIPER OF A POTENTIOMETER

FIELD AND BACKGROUND OF THE INVENTION

The present invention relates to a circuit for monitoring contact between the resistance track and the wiper of a potentiometer providing an adjustable DC voltage which is tapped from the wiper.

In safety-relevant desired-value or actual-value transmitters such as in a system for the electric control of the engine power (E-gas-system) in a motor vehicle, serious consequences can result from a lack of contact between the wiper and the resistance track of a potentiometer. In addition to other safety devices, for instance the provision of switches at predetermined potentiometer positions, a circuit for monitoring the internal resistance of a transmitter is known in which the transmitter is so connected to an oscillator that the internal resistance of the transmitter controls the oscillating ability of the oscillator and in which the output voltage of the oscillator is fed to a demodulator (German patent document 36 43 945 A1). In this known circuit arrangement, however, the coupling of the oscillator to the output of the transmitter is relatively expensive. Furthermore, the known circuit requires a separate oscillator which oscillates independently of other circuits, or does not oscillate.

SUMMARY OF THE INVENTION

It is an object of the present invention to provide a circuit for monitoring contact between the resistance track and wiper of a potentiometer, which circuit is of the simplest possible construction and operates dependably.

According to the invention, an alternating voltage can be fed to the wiper (3) via a series circuit of a resistor (15) and a capacitor (16), the resistance of the resistor (15) being greater than the impedance formed by the capacitance of the capacitor (16) and by one-fourth of the potentiometer track resistance, and means (8) are provided to rectify the voltage at a junction point (17) between the resistor (15) and the capacitor (16).

According to another embodiment of the invention, both terminals of the resistance track can be acted on by an alternating voltage, and means (8) for rectifying the alternating voltage on the wiper (3) are provided.

Both embodiments of the invention have the advantage that, in order to produce the alternating voltage, a source can be used which is in any event present or can be realized in simple fashion together with other circuits.

In order to prevent the alternating voltage from being conducted forward together with the DC voltage which is to be set, in accordance with a further feature, the wiper (3) is also connected to the input of a low-pass filter (4, 5).

One simple possibility for producing the alternating voltage with the aid of a microcomputer, which is in any event present for control in regulating systems, is afforded, in connection with another feature, by the alternating voltage being of rectangular shape.

In one advantageous embodiment of the invention, the rectifying means (8) is a peak-value rectifier. In the case of a sinusoidal voltage, a direct-voltage value is produced which corresponds to twice the peak value of the alternating voltage. In the case of a rectangular alternating voltage, the output voltage of the peak-value rectifier represents the total amplitude.

Another advantageous feature of the invention is that the output of the low-pass filter (4, 5), possibly via an impedance transformer (6), and the output of the rectifying means (8) are connected to analog inputs (28, 29) of a microcomputer (21), which furthermore serves to produce a rectangular alternating voltage. In this connection the frequency of the alternating voltage is preferably about 1 kHz.

The invention permits various embodiments. One of them is shown diagrammatically in the figures of the drawing and will be described below.

BRIEF DESCRIPTION OF THE DRAWING

With the above and other objects and advantages in view, the present invention will become more clearly understood in connection with the detailed description of preferred embodiments, when considered with the accompanying drawings, of which.

Identical parts are provided in the figures with the same reference numerals.

DETAILED DESCRIPTION OF THE DRAWINGS

Figure 1:
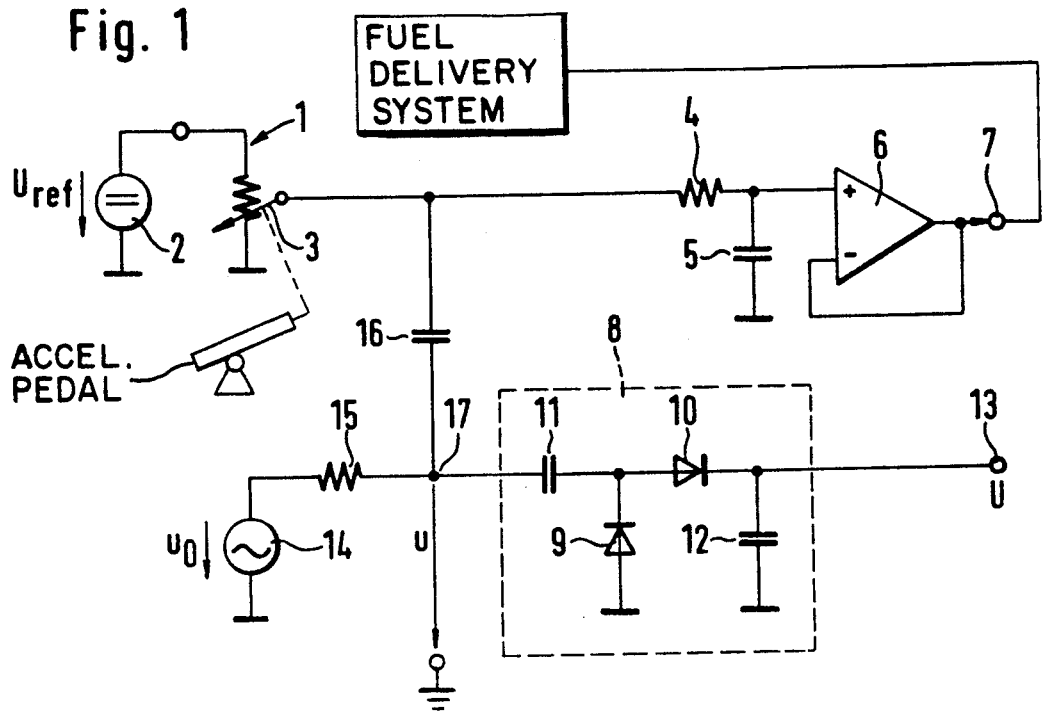
FIG. 1 is a circuit diagram of a first embodiment.

In all three embodiments, the resistance track of the potentiometer 1 is connected to a source of DC voltage 2 for the production of a reference voltage $U_{ref}$. The DC voltage which can be tapped off from the wiper 3 of the potentiometer 1 is indicated by the potentiometer position—upon use as desired-value transmitter of an E-gas-system (electronically-controlled fuel-delivery system) therefore, the position of the accelerator pedal. This DC voltage is fed also to an output 7 via a low-pass filter comprising resistor 4, capacitor 5, and an operational amplifier 6, connected as impedance transformer. For example, in an automotive vehicle, the wiper of the potentiometer 1 is connected mechanically to the accelerator pedal, and the output voltage of the potentiometer 1 is applied, via output 7, as a signal to the fuel delivery system. In the practice of the invention, an alternating voltage (AC) is applied, as described below, to the wiper 3. The low-pass filter blocks conduction of the AC voltage to the output 7. For the measurement of the alternating voltage present on the wiper 3 there is provided a peak-value rectifier 8 which consists, in known manner, of two rectifier diodes 9, 10 and two capacitors 11, 12. A voltage U which corresponds to the total amplitude of the alternating voltage u can be obtained at the output 13 of the peak-value rectifier.

In order to monitor the contact between the wiper 3 and the resistance track, a source of alternating voltage 14 is connected, in the embodiment shown in FIG. 1, via a resistor 15 and a capacitor 16 to the wiper 3. The input of the peak-value rectifier 8 is connected to a junction point 17 between the resistor 15 and the capacitor 16. When the potentiometer 1 is intact, the alternating voltage u is divided up in the ratio of the impedance from the series connection of the capacitor 16 with the parallel circuit of the two partial resistances of the potentiometer 1 to the total impedance, including the resistance 15. In this case, a very small internal resistance of the reference voltage source 2 is assumed.

If the resistance 15 is now much larger than the reactance of the capacitor 16 and also much larger than one-fourth of the track resistance of the potentiometer 1 then, with potentiometer 1 intact, a voltage U is obtained at the output 13 which is very much smaller than the peak value of the alternating voltage u. However, if there is an interruption between the wiper 3 and the resistance track of the potentiometer 1, then the entire alternating voltage u is fed to the peak-value rectifier 8, as a result of which the voltage U becomes correspondingly high. The signal which is thus present can be suitably evaluated in order, for instance, to place a warning device in operation or to activate an emergency procedure.

Figure 2:
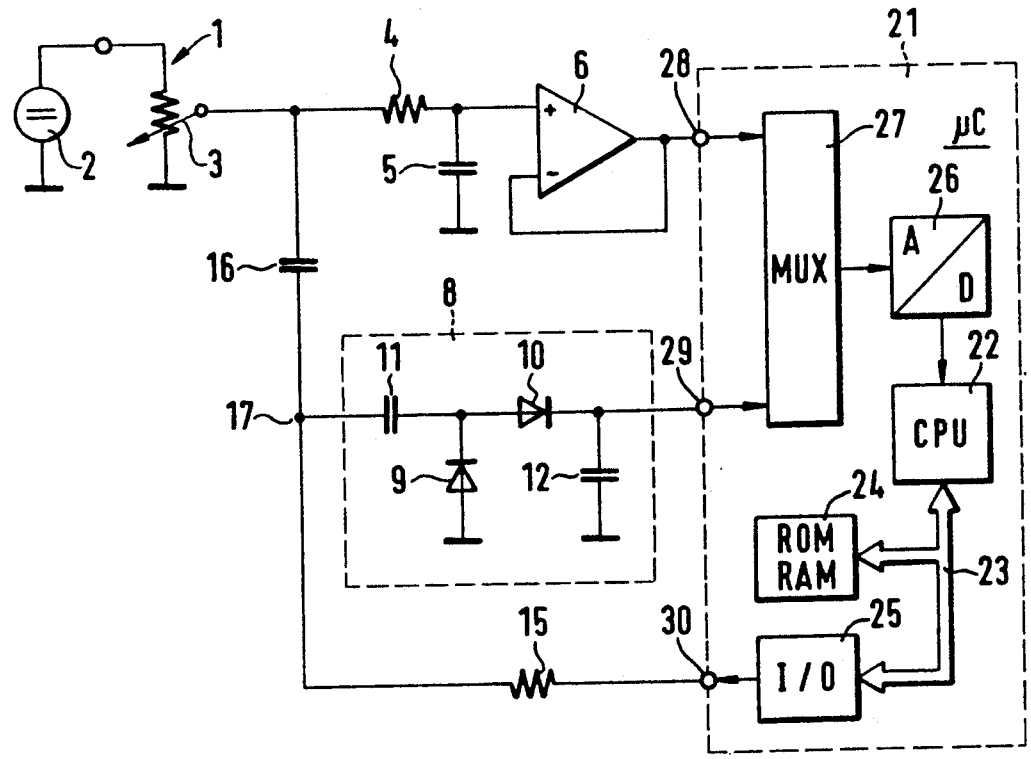
FIG. 2 shows a second embodiment, in part as block diagram.

FIG. 2 shows, as second embodiment, a circuit according to the invention together with a microcomputer 21 which serves for control and regulating purposes. Since suitable microcomputers are known per se, the most important components of the microcomputer 21 are shown, namely the central processing unit 22, the bus system 23, various memories 24, an input-output unit 25, an analog-digital converter 26 and a multiplexer 27. The direct voltage set and the voltage U are fed to two analog inputs 28, 29 of the microcomputer 21. A rectangular alternating voltage is produced at one output 30, it being fed via the resistor 15 to the circuit point 17. Other inputs and outputs (not shown) of the microcomputer 21 can be connected to different sensors and setting members, as required by the corresponding control or regulating device.

Various programs are used in the microcomputer, including a program for evaluating the DC voltage set by means of the potentiometer 1 and for evaluating the output voltage U of the peak-value rectifier 8. If the latter exceeds a predetermined threshold value then the programs provided for the event of a break of the wiper 1 are activated in the microcomputer 21.

Figure 3:
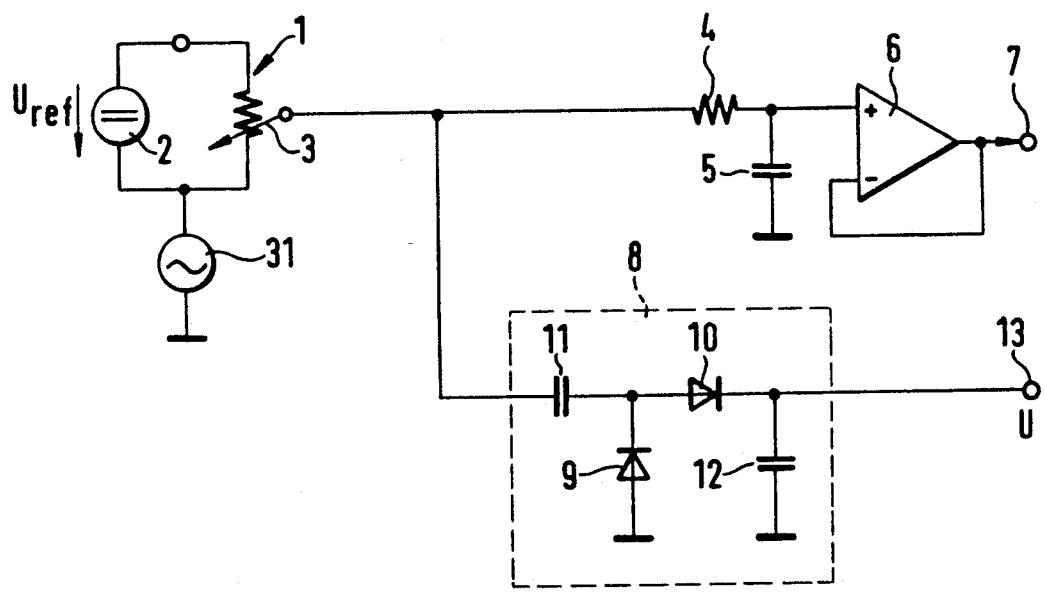
FIG. 3 is a circuit diagram of a third embodiment.

In the embodiment shown in FIG. 3, the alternating voltage is fed from a source of alternating voltage 31 to the one end of the resistance track directly and to the other end of the resistance track via the DC voltage source 2. As long as contact is present between the wiper 3 and the resistance track, an alternating voltage which is practically independent of the potentiometer setting is present on the wiper. This is indicated by a correspondingly high voltage U at the output 13 of the peak-value rectifier 8. If the contact is broken by a defect, then no alternating voltage is conducted any longer to the wiper 7, whereupon the voltage U becomes 0.

I claim:

1. A circuit for monitoring the contact between the resistance track and the wiper of a potentiometer, wherein the potentiometer provides an adjustable DC voltage to be tapped from the wiper, the circuit comprising:
   a series circuit of a resistor and a capacitor;
   a source of alternating voltage applying alternating voltage to the wiper via the series circuit; and
   means for rectifying voltage at a junction point between the resistor and the capacitor of the series circuit; and
   wherein resistance of the resistor is greater than an impedance formed by the capacitance of the capacitor plus one-fourth of the track resistance.

2. A circuit according to claim 1, further comprising a low-pass filter coupled to a wiper terminal of the potentiometer.

3. A circuit according to claim 2, further comprising
   a microcomputer, and an impedance transformer coupling an output terminal of the low-pass filter to a first analog input terminal of the microcomputer;
   wherein an output terminal of the rectifying means is connected to a second analog input terminal of the microcomputer; and
   the source of alternating voltage is constructed as a part of the microcomputer for producing an alternating voltage having a rectangular waveform.

4. A circuit according to claim 1, wherein
   the alternating voltage has a rectangular shape.

5. A circuit according to claim 1, wherein
   the rectifying means is a peak-value rectifier.

6. A circuit for monitoring the contact between the resistance track and the wiper of a potentiometer, wherein the potentiometer provides an adjustable DC voltage to be tapped from the wiper, the circuit comprising:
   a source of DC voltage applying a DC voltage across the resistance track of the potentiometer;
   a source of alternating voltage applying alternating (AC) voltage directly to a first terminal of the resistance track and via the DC voltage source to a second terminal of the resistance track, both AC voltage and DC voltage being outputted from the potentiometer at the wiper;
   means connecting to the wiper for separating the AC voltage from the DC voltage; and
   means for rectifying an alternating voltage on the wiper to provide the magnitude of the alternating voltage, the magnitude of the alternating voltage serving as an indicator of the condition of contact between the resistance track and the wiper.

7. A circuit according to claim 6, wherein the separating means comprises a low-pass filter coupled to a wiper terminal of the potentiometer.

8. A circuit for monitoring the contact between the resistance track and the wiper of a potentiometer, wherein the potentiometer provides an adjustable DC voltage to be tapped from the wiper, the circuit comprising:
   a source of alternating voltage applying alternating voltage to both terminals of the resistance track;
   means for rectifying an alternating voltage on the wiper;
   a low-pass filter coupled to a wiper terminal of the potentiometer;
   a microcomputer, and an impedance transformer coupling an output terminal of the low-pass filter to a first analog input terminal of the microcomputer;
   wherein an output terminal of the rectifying means is connected to a second analog input terminal of the microcomputer; and
   the source of alternating voltage is constructed as a part of the microcomputer for producing an alternating voltage having a rectangular waveform.

9. A circuit according to claim 8, wherein the frequency of the alternating voltage is preferably about 1 kHz.

* * * * *